（12）United States Patent
He et al.

(10) Patent No.: US 12,310,215 B2
(45) Date of Patent: May 20, 2025

(54) ORGANIC LIGHT EMITTING DIODE DEVICE, METHOD FOR MANUFACTURING THE SAME AND DISPLAY DEVICE

(71) Applicant: BOE TECHNOLOGY GROUP CO., LTD., Beijing (CN)

(72) Inventors: Fang He, Beijing (CN); Shi Shu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 570 days.

(21) Appl. No.: 17/572,120

(22) Filed: Jan. 10, 2022

(65) Prior Publication Data
US 2022/0130909 A1  Apr. 28, 2022

Related U.S. Application Data

(62) Division of application No. 16/028,848, filed on Jul. 6, 2018, now Pat. No. 11,251,232.

(30) Foreign Application Priority Data

Nov. 14, 2017  (CN) .......................... 201711121557.0

(51) Int. Cl.
*H10K 59/38*   (2023.01)
*H10K 50/844*  (2023.01)
(Continued)

(52) U.S. Cl.
CPC ........... *H10K 59/38* (2023.02); *H10K 50/844* (2023.02); *H10K 50/858* (2023.02); *H10K 50/86* (2023.02);
(Continued)

(58) Field of Classification Search
CPC ...... H10K 59/122; H10K 59/30; H10K 59/35; H10K 59/352; H10K 59/353; H10K 59/38;
(Continued)

(56) References Cited

U.S. PATENT DOCUMENTS

2004/0239841 A1  12/2004  Nada et al.
2006/0061708 A1*  3/2006  Umebayashi ........ G02B 3/0012
                                                   349/95
(Continued)

FOREIGN PATENT DOCUMENTS

| CN | 101071224 A | 11/2007 |
| CN | 102799016 A | 11/2012 |
| JP | H07253509 A | 10/1995 |

OTHER PUBLICATIONS

Restriction Requirement dated Jul. 31, 2019 corresponding to U.S. Appl. No. 16/028,848.
(Continued)

*Primary Examiner* — Donald HB Braswell
*Assistant Examiner* — John Lin
(74) *Attorney, Agent, or Firm* — Nath, Goldberg & Meyer; Joshua B. Goldberg

(57) ABSTRACT

A method for manufacturing the display substrate is provided, including providing a substrate, providing a green light emitting element on the substrate forming a green color resist film layer on a light exit side of the green light emitting element; forming a pattern including a green color film layer
(Continued)

by adjusting a irradiation time of the exposure light irradiated to the green color resist film layer using a digital gray scale adjustment method.

13 Claims, 9 Drawing Sheets

(51) Int. Cl.
    *H10K 50/858*     (2023.01)
    *H10K 50/86*     (2023.01)
    *H10K 59/122*     (2023.01)
    *H10K 59/35*     (2023.01)
    *H10K 71/00*     (2023.01)
    *H10K 71/20*     (2023.01)

(52) U.S. Cl.
    CPC ......... *H10K 50/865* (2023.02); *H10K 59/122* (2023.02); *H10K 59/35* (2023.02); *H10K 71/00* (2023.02); *H10K 71/233* (2023.02)

(58) Field of Classification Search
    CPC .... H10K 59/87; H10K 59/875; H10K 59/879; H10K 50/84; H10K 50/844; H10K 50/85; H10K 50/858; H10K 50/865; H10K 71/00; H10K 71/20; H10K 71/233
    See application file for complete search history.

(56) References Cited

U.S. PATENT DOCUMENTS

| | | | |
|---|---|---|---|
| 2010/0327304 A1 | 12/2010 | Sonada et al. | |
| 2012/0175648 A1* | 7/2012 | Kasano | H10K 50/858 257/E33.073 |
| 2012/0218173 A1* | 8/2012 | Ohta | H10K 50/858 345/76 |
| 2012/0300160 A1 | 11/2012 | Lee et al. | |

OTHER PUBLICATIONS

Non-Final Office Action dated Jan. 10, 2020 corresponding to U.S. Appl. No. 16/028,848.
Final Office Action dated Jun. 1, 2020 corresponding to U.S. Appl. No. 16/028,848.
Non-Final Office Action dated Sep. 24, 2020 corresponding to United States U.S. Appl. No. 16/028,848.
Final Office Action dated Mar. 26, 2021 corresponding to U.S. Appl. No. 16/028,848.
First Office Action dated Nov. 15, 2019 for corresponding Chinese application 201711121557.0 with English translation.

* cited by examiner

ORGANIC LIGHT EMITTING DIODE DEVICE, METHOD FOR MANUFACTURING THE SAME AND DISPLAY DEVICE

CROSS-REFERENCE TO RELATED APPLICATION

This application claims the priority of Chinese Patent Application No. 201711121557.0 entitled "An organic light emitting diode device, Method for manufacturing the same and display device" submitted on Nov. 14, 2017, the disclosure of which is incorporated herein in its entirety by reference.

TECHNICAL FIELD

The present disclosure relates to the field of organic light emitting diode (OLED), particularly to an organic light emitting diode device, an organic light emitting diode display panel, a method for manufacturing the organic light emitting diode device and a display device.

BACKGROUND

Recently, organic light emitting diode (OLED) products have become increasingly popular in small and medium-sized products. The most important advantage in future OLED products is that they can be bent, therefore, there is a need to continuously reduce the thickness of the OLED display panel. However, in order to reduce the reflectivity of OLED display panel, a circular polarizer needs to be attached. Therefore, the overall thickness of the OLED display panel cannot support random bending yet.

COE (CF on EL) technology forms a color resist layer (ie, CF, color film layer) on a thin film encapsulated organic electroluminescent (EL) device, and such structure has the effects of reducing the reflectivity of the OLED panel, increasing its color purity, reducing the thickness of the panel, and the like.

SUMMARY

The present disclosure provides an organic light emitting diode device, including a substrate, a green light emitting element on the substrate, and a green color film layer disposed on a light exit side of the green light emitting element correspondingly, and a travel distance of a light emitted from the green light emitting element in the green color film layer remains substantially unchanged with a change of a light exit angle of the light.

Optionally, the organic light emitting diode device further includes a red light emitting element on the substrate, and a red color film layer disposed on a light exit side of the red light emitting element correspondingly, and a blue light emitting element on the substrate, and a blue color film layer disposed on a light exit side of the blue light emitting element correspondingly, the travel distance of the light emitted from the red light emitting element and the blue light emitting element in the red color film layer and the blue color film layer respectively, increase as light exit angles increase, so that a color purity of the light emitted from the red light emitting element and the blue light emitting element remains changed after passing through the red color film layer and the blue color film layer respectively.

Optionally, the organic light emitting diode device further includes a pixel defining layer and a black matrix, the pixel defining layer is disposed in the same layer as the red light emitting element, the green light emitting element and the blue light emitting element, the pixel defining layer separates the red light emitting element, the green light emitting element and the blue light emitting element from each other; the black matrix is disposed in the same layer as the red color film layer, the green color film layer and the blue color film layer, and the black matrix separates the red color film layer, the green color film layer and the blue color film layer from each other.

Optionally, a orthogonal projection of the red light emitting element on the substrate coincides with a orthogonal projection of the red color film layer on the substrate, a orthogonal projection of the green light emitting element on the substrate coincides with a orthogonal projection of the green color film layer on the substrate, a orthogonal projection of the blue light emitting element on the substrate coincides with the orthogonal projection of the blue color film layer on the substrate, and a orthogonal projection of the black matrix on the substrate coincides with the pixel defining layer on the substrate.

Optionally, the organic light emitting diode device further includes a flat layer, and the flat layer is disposed on a side of the red color film layer, the green color film layer and the blue color film layer away from the red light emitting element, the green light emitting element and the blue light emitting element.

Optionally, the organic light emitting diode device further includes a encapsulating layer that is disposed between the red color film layer, the green color film layer and the blue color film layer and the red light emitting element, the green light emitting element and the blue light emitting element, and is used to encapsulate the red light emitting element, the green light emitting element and the blue light emitting element.

Optionally, the green light emitting element, the red light emitting element and/or the blue light emitting element are point light-emitting light sources, the travel distance refers to a distance that the light entering from a projection center of the green color film layer, the red color film layer or the blue color film layer on the substrate and emitted by the point light emitting light source travels in the corresponding color film layer when leaving the corresponding color film layer, and the light exit angle refers to an angle between a propagating direction of the light emitted from the point light-emitting light source in the green color film layer, the red color film layer or the blue color film layer and a direction perpendicular to a surface of the organic light emitting diode device.

Optionally, the green color film layer, the red color film layer and/or the blue color film layer are roughly hemispherical.

The present disclosure also provides an organic light emitting diode display panel including the above organic light emitting diode device.

The present disclosure also provides a method for manufacturing the organic light emitting diode device, including:
providing a substrate,
providing a green light emitting element on the substrate,
forming a green color resist film layer on a light exit side of the green light emitting element;
forming a pattern including a green color film layer by adjusting an irradiation time of exposure light irradiated to the green color resist film layer using a digital gray scale adjustment method;
wherein a travel distance of a light emitted from the green light emitting element in the green color film layer remains substantially unchanged with a change of a light exit angle of the light.

Optionally, an area of the green color resist film layer corresponding to the green light emitting element is a first area; the green color resist film layer uses negative photoresist, and the irradiation time of exposure light irradiated to a peripheral edge portion of the first area is less than the irradiation time of exposure light irradiated to a middle portion of the first area.

Optionally, the method further includes:

providing a red light emitting element and a blue light emitting element on the substrate;

forming a red color resist film layer on a light exit side of the red light emitting element;

forming a pattern including the red color film layer by adjusting an irradiation time of exposure light irradiated to the red color resist film layer using a digital gray scale adjustment method;

forming a blue color resist film layer on a light exit side of the blue light emitting element;

forming a pattern including the blue color film layer by adjusting an irradiation time of exposure light irradiated to the blue color resist film layer using a digital gray scale adjustment method;

wherein the travel distance of a light emitted from the red light emitting element and the blue light emitting element in the red color film layer and the blue color film layer respectively, increase as light exit angles increase, so that a color purity of the light emitted from the red light emitting element and the blue light emitting element remain unchanged after passing through the red color film layer and the blue color film layer respectively.

Optionally, an area of the red color resist film layer corresponding to the red light emitting element is a second area; an area of the blue color resist film layer corresponding to the blue light emitting element is a third area;

an irradiation time of exposure light irradiated to the second area is the same on the entire portion;

an irradiation time of exposure light irradiated to the third area is the same on the entire portion.

The present disclosure also provides a display device including the above organic light emitting diode display panel.

In the organic light emitting diode device provided by the present disclosure, by making the travel distance of the light emitted from the green light emitting element in the green color film layer remain substantially unchanged with the change of the output angle of the light, the color purity of the green light passing through the green color film layer can be prevented from changing, thereby improving the color shift performance of the green light passing through the green color film layer, and improving the optical performance of the green light, and thus further improving the display effect of the organic light emitting diode device and the display panel.

The display device provided by the present disclosure improves the display effect and quality by using the above organic light emitting diode display panel.

BRIEF DESCRIPTION OF DRAWINGS

The accompanying drawings, which constitute a part of the description, are included to provide a further understanding of the present disclosure and are incorporated to illustrate the present disclosure together with the following embodiments, and are not to be considered as limiting the present disclosure. In the drawings.

DETAIL DESCRIPTION OF EMBODIMENTS

In order to enable those skilled in the art to better understand the technical solutions of the present disclosure, an organic light emitting diode device, a method for manufacturing the same and a display device provided by the present disclosure will be further described in detail with reference to the drawings and specific examples.

Figure 1:
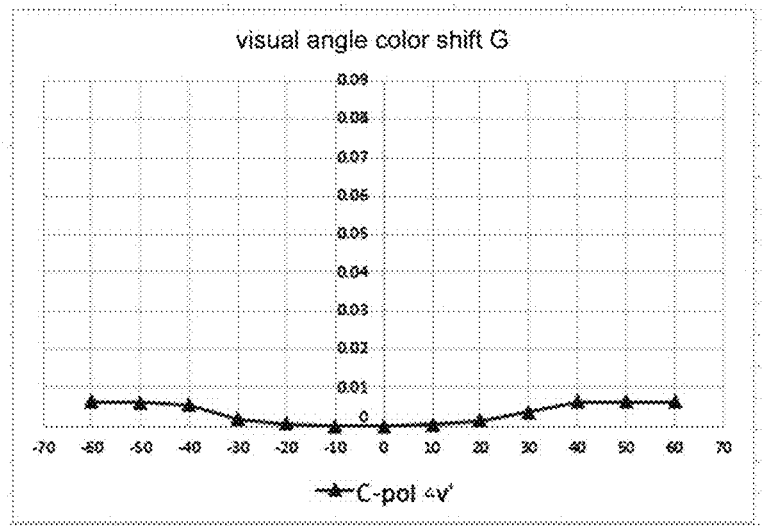
FIG. 1 is a schematic diagram showing a change of color purity of a light emitting spectra of a green light OLED device with a change of a light exit angle.
Figure 2:
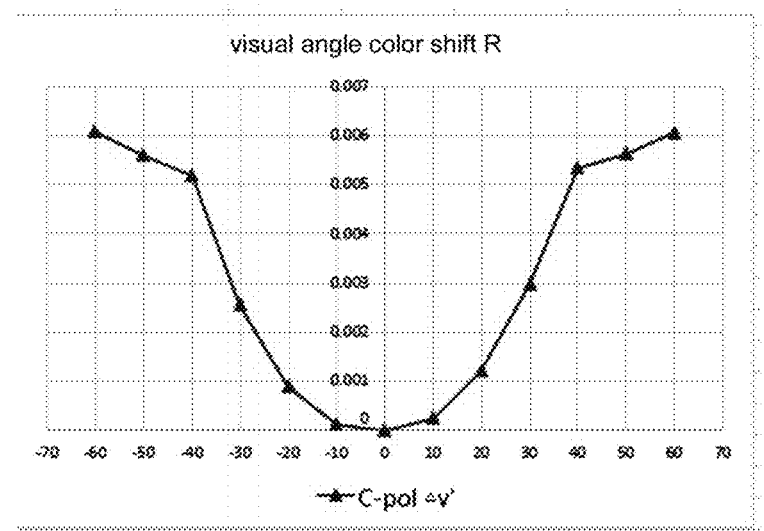
FIG. 2 is a schematic diagram showing a change of color purity of a light emitting spectra of a red light OLED device with a change of the light exit angle.
Figure 3:
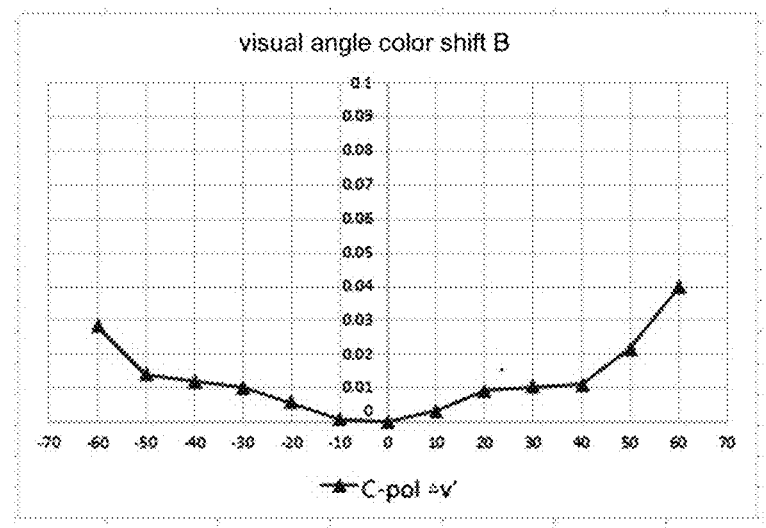
FIG. 3 is a schematic diagram showing a change of color purity of a light emitting spectra of a blue light OLED device with a change of the light exit angle.

COE (CF on EL) technology forms a color resist layer (ie, CF, color film layer) on a thin film encapsulated organic electroluminescent (EL) device, and such structure has the effects of reducing a reflectivity of the OLED panel, increasing its color purity, reducing the thickness of the panel, and the like. However, since the actual travel distance of the emitted light at different angles in the CF film layer is different, the color purity of the emitted light at different light emitting angles is different. Specifically, a change of a color purity of a light emitting spectra of a green light OLED device (i.e., a visual angle color shift) is not obvious with a change of the light exit angle (as shown in FIG. 1), however, when the light exit angle of the light is relatively large, the travel distance thereof in the green color film layer is larger, resulting in deepening of the color of the emitted light and a large change in the color purity; while the color purity of the light emitting spectra of the red OLED device and the blue OLED device will decrease as the light exit angle increases (i.e., the change of the visual angle color shift is shown in FIG. 2 and FIG. 3), however, in the case where the light exit angle is large, the travel distance of the light emitted from the red OLED device and the blue OLED device in the red color film layer and the blue color film layer respectively is larger, which will increase the color purity of the light emitted from the red OLED device and the blue OLED device. Therefore, part of the color purity thereof decreased with an increase of the light exit angle is compensated, and finally, the color purity of the emitting light of the red OLED device and the blue OLED device does not greatly change after the emitted light passes through the corresponding color film layers.

In other words, with respect to the OLED panel with a COE structure, a color purity of red light and blue light does not change significantly with increase of a light exit angle of a light emitted from the OLED light source, but a color purity of green light is changed greatly. As a result, an optical performance of the OLED panel with a COE structure during display is not ideal, which affects its display effect.

The present disclosure solves a technical problem through the following technical solutions that in OLED devices with a COE structure, the color purity of green light changes greatly with the increase of the light exit angle, resulting in poor optical performance of the OLED devices with a COE structure during display and affecting the display effect.

Figure 4:
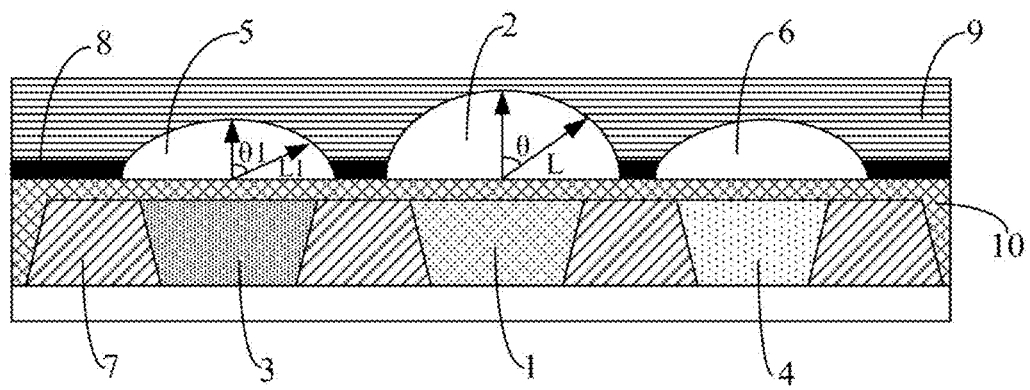
FIG. 4 is a schematic structural cross-sectional diagram showing the structure of the organic light emitting diode device in some Examples of the present disclosure.

In some Examples, an organic light emitting diode device (OLED device) is provided. As shown in FIG. 4, the OLED device includes a substrate (not shown in the figure), a green light emitting element 1 on the substrate, and a green color film layer 2 disposed on a light exit side of the green light emitting element 1 correspondingly, wherein a travel distance L of the light emitted from the green light emitting element 1 in the green color film layer 2 remains substantially unchanged with a change of the light exit angle θ. The expression "substantially unchanged" means that the travel distance L does not change by more than 5% with the change of the light exit angle θ.

The green light emitting element 1 may be a point light-emitting light source. The travel distance L refers to a distance that the light entering from the center of the green color film layer (namely, a projection center of the green color film layer on the substrate) and emitted by the point light emitting light source travels in the green color film layer when leaving the green color film layer, and the light exit angle θ refers to an angle between a propagating direction of the light emitted from the point light-emitting light source and the direction perpendicular to the surface of the OLED device.

As mentioned above, the change of the color purity of the light (green light) emitted from the green light emitting element 1 is not obvious with the change of the light exit angle, but when the light emitted from the green light emitting element 1 exits through the green color film layer 2, if the travel distance of the light in the green color film layer 2 also changes with the change of the light exit angle θ, the color purity of the emitted light thereof will change greatly. Therefore, by making the travel distance L of the light emitted from the green light emitting element 1 in the green color film layer 2 remain substantially unchanged with the change of the light exit angle θ, the color purity of the green light passing through the green color film layer 2 can be prevented from changing, thereby improving the color shift performance of the green light passing through the green color film layer 2, and improving the optical performance of the green light, and thus further improving the performance of the organic light emitting diode device and the display effect of the display panel using the organic light emitting diode device.

In these examples, the OLED device further includes a red light emitting element 3 on the substrate, a blue light emitting element 4 on the substrate, and a red color film layer 5 and a blue color film layer 6 disposed on the light exit side of the red light emitting element 3 and blue light emitting element 4 correspondingly; the travel distance L1 of the light emitted from the red light emitting element 3 and the blue light emitting element 4 in the red color film layer 5 and the blue color film layer 6 respectively, increase as a light exit angle θ1 increases, so that the color purity of the light emitted from the red light emitting element 3 and the blue light emitting element 4 remains unchanged after passing through the red color film layer 5 and the blue color film layer 6 respectively.

Both the red light emitting element 3 and the blue light emitting element 4 may be a point light-emitting light source. The travel distance L1 refers to a distance that the light entering from the center of the red color film layer or the blue color film layer (a projection center of the red color film layer or the blue color film layer on the substrate) and emitted by the point light emitting light source travels in the color film layer when leaving the color film layer, and the light exit angle θ1 refers to a angle between the propagating direction of the light emitted from the point light-emitting light source and the direction perpendicular to the surface of the OLED device.

Since the color purity of the light emitted from the red light emitting element 3 and the blue light emitting element 4 decreases with the increase of the light exit angle θ1, and after the light (red light and blue light, respectively) emitted from the red light emitting element 3 and the blue light emitting element 4 passes through the red color film layer 5 and the blue color film layer 6 respectively, the travel distance L1 of the emitting light in the red color film layer 5 and the blue color film layer 6 also increases with the increase of the light exit angle θ1, the color purity of the light emitted by the red light emitting element 3 and the blue light emitting element 4 can be increased. Therefore, by making the travel distance L1 of the light emitted from the red light emitting element 3 and the blue light emitting element 4 in the corresponding red color film layer 5 and the blue color film layer 6 increase with the increase of the light exit angle θ1, part of the color purity of the light emitted from the red light emitting element 3 and the blue light emitting element 4 decreased with an increase in the light exit angle is compensated, and finally, the color purity of the light emitted from the red light emitting element 3 and the blue light emitting element 4 does not greatly change after the emitted light passes through the corresponding color film layer. As a result, the red light and the blue light have good optical performance, and finally the OLED device has a good optical performance, thereby improving the display effect of the OLED display panel using the OLED device.

Figure 5:
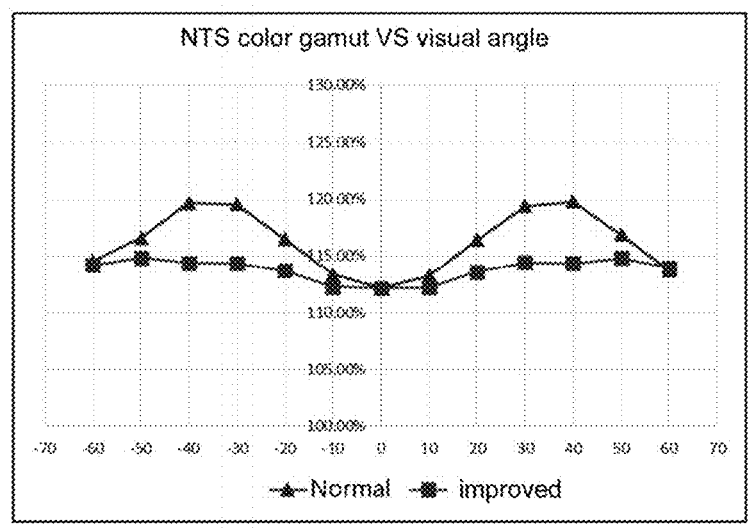
FIG. 5 is a schematic diagram of a change in a display color gamut of the organic light emitting diode device with a viewing angle before and after the improvement of the green color film layer.
Figure 6:
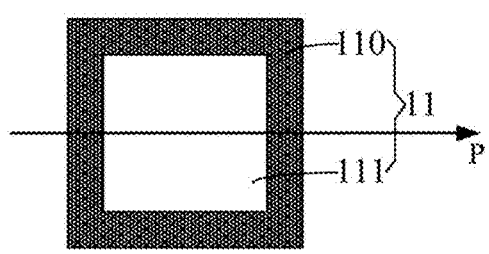
FIG. 6 is a schematic diagram showing the exposure amount of the peripheral edge portion and the middle portion of the first area of the green color resist film layer according to the method of the present disclosure.
Figure 7A:
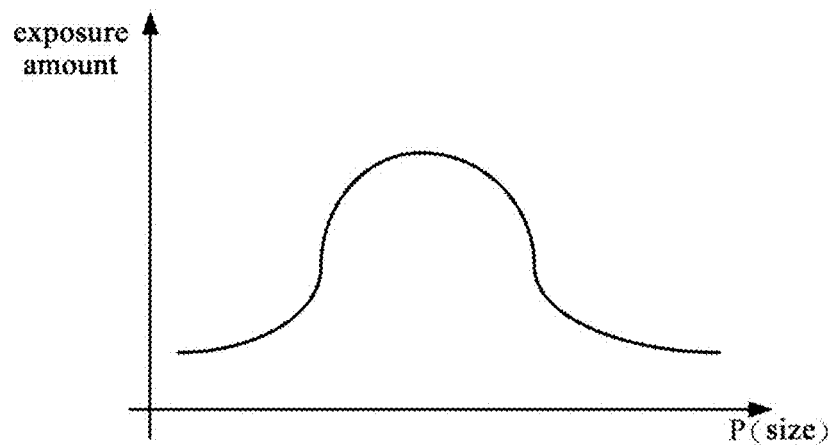
FIG. 7a is a graph showing the exposure amount of the first area of the green color resist film layer in the P direction according to the method of the present disclosure.
Figure 7B:
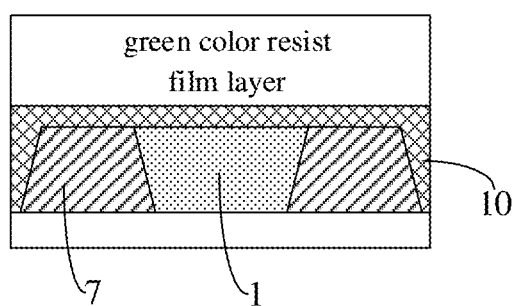
FIG. 7b is a graph showing a step of forming a green color resist film layer on a light exit side of the green light emitting element.
Figure 7C:
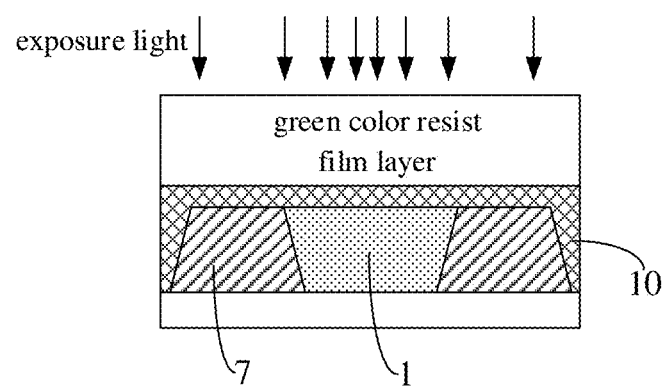
FIG. 7c is a graph showing a step of forming a green color film layer by adjusting irradiation time of exposure light irradiated to the green color resist film layer using a digital gray scale adjustment method.
Figure 8:
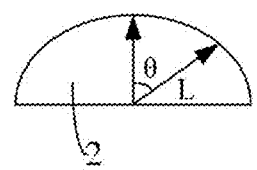
FIG. 8 is a cross-sectional diagram showing the green color film layer corresponding to the green light emitting element formed after the exposure according to the exposure amount curve in FIG. 7a and performing the steps shown in FIGS. 7b and 7c.
Figure 9:
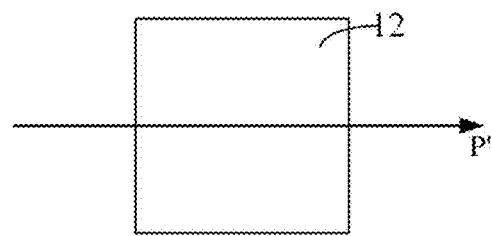
FIG. 9 is a schematic diagram showing the exposure amount of the second area of the red color resist film layer according to the method of the present disclosure.
Figure 10A:
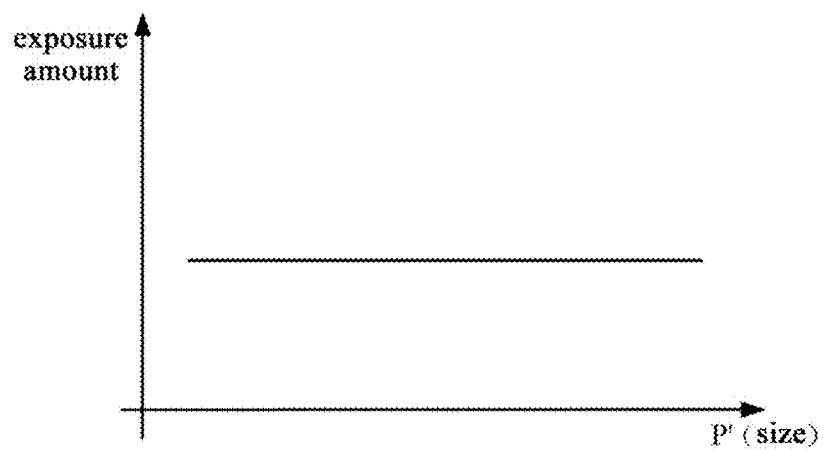
FIG. 10a is a curve showing the exposure amount of the second area of the red color resist film layer in the P' direction according to the method of the present disclosure.
Figure 10B:
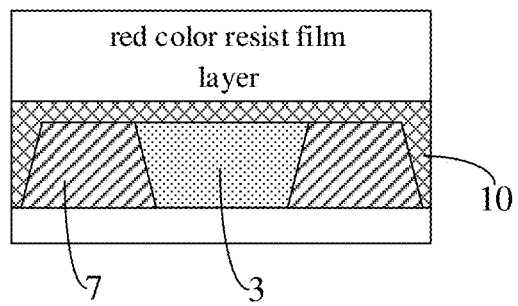
FIG. 10b is a graph showing a step of forming a red color resist film layer on a light exit side of the green light emitting element.
Figure 10C:
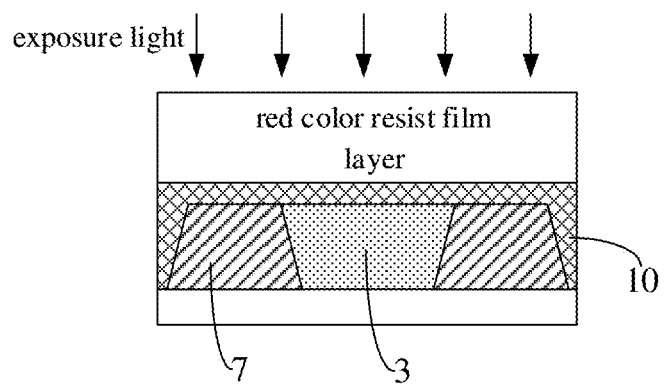
FIG. 10c is a graph showing a step of forming a red color film layer by adjusting irradiation time of exposure light irradiated to the red color resist film layer using a digital gray scale adjustment method.
Figure 11:
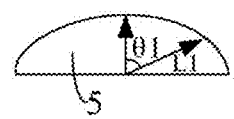
FIG. 11 is a cross-sectional diagram showing the red color film layer corresponding to the red light emitting element formed after the exposure according to the exposure amount curve in FIG. 10a and performing the steps shown in FIGS. 10b and 10c.
Figure 12:
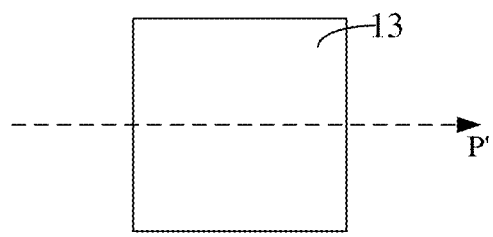
FIG. 12 is a schematic diagram showing the exposure amount of the third area of the blue color resist film layer according to the method of the present disclosure.
Figure 13A:
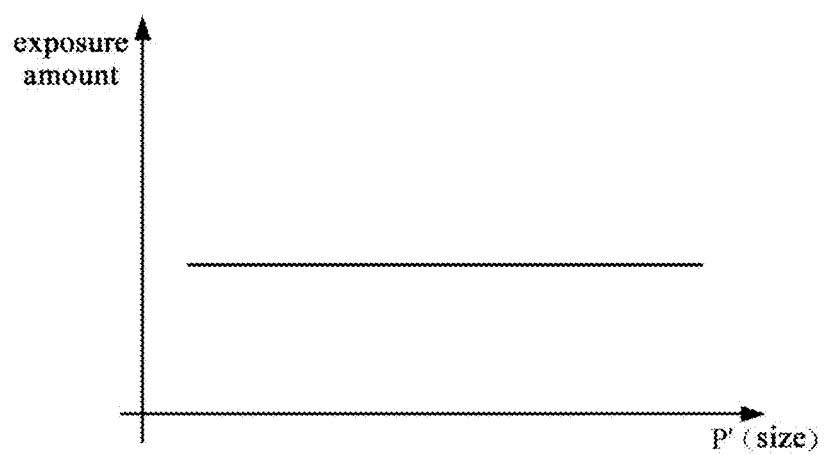
FIG. 13a is a curve showing the exposure amount of the third area of the blue color resist film layer in the P' direction according to the method of the present disclosure.
Figure 13B:
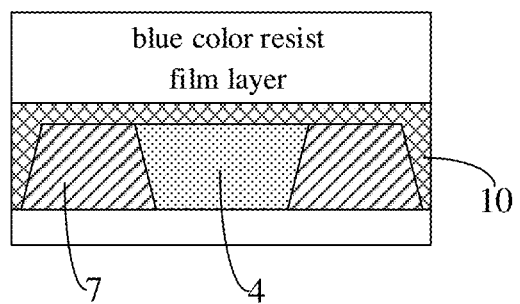
FIG. 13b is a graph showing a step of forming a blue color resist film layer on a light exit side of the green light emitting element.
Figure 13C:
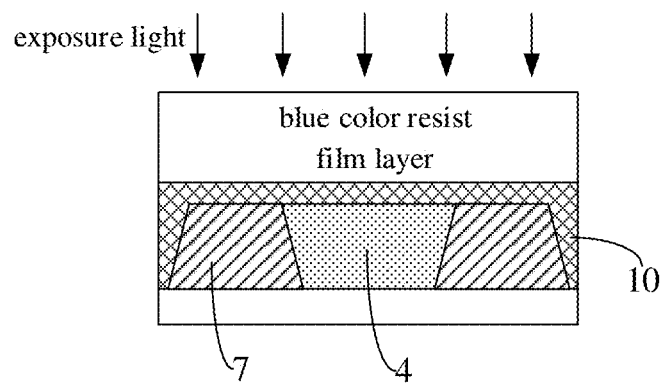
FIG. 13c is a graph showing a step of forming a blue color film layer by adjusting irradiation time of exposure light irradiated to the blue color resist film layer using a digital gray scale adjustment method.
Figure 14:
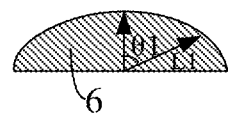
FIG. 14 is a cross-sectional diagram showing the blue color film layer corresponding to the blue light emitting element formed after the exposure according to the exposure amount curve in FIG. 13a and performing the steps shown in FIGS. 13b and 13c.

As shown in FIG. 5, by comparing the change of the display color gamut of the organic light emitting diode display panel including the organic light emitting diode device modified by the above-mentioned technique with a visual angle (i.e., the light exit angle) with the case without modification, it can be seen that by adopting the above technical solution, the change magnitude of the display color gamut of the organic light emitting diode panel significantly decreases with the visual angle and the display quality of the organic light emitting diode display panel is significantly improved.

In this example, as shown in FIG. 4, the organic light emitting diode display device further includes a pixel defining layer 7 and a black matrix 8, the pixel defining layer 7 is disposed in the same layer as the red light emitting element 3, the green light emitting element 1 and the blue light emitting element 4, the pixel defining layer 7 separates the red light emitting element 3, the green light emitting element 1 and the blue light emitting element 4 from each other. The black matrix 8 is disposed in the same layer as the red color film layer 5, the green color film layer 2 and the blue color film layer 6, and the black matrix 8 separates the red color film layer 5, the green color film layer 2 and the color film layer 6 from each other. A orthogonal projection of the red light emitting element 3 on the substrate covers (preferably coincides with) a orthogonal projection of the red color film layer 5 on the substrate, the orthogonal projection of the green light emitting element 1 on the substrate covers (preferably coincides with) the orthogonal projection of the green color film layer 2 on the substrate, the orthogonal projection of the blue light emitting element 4 on the substrate covers (preferably coincides with) the orthogonal projection of the blue color film layer 6 on the substrate, the orthogonal projection of the black matrix 8 on the substrate covers (preferably coincides with) the pixel defining layer 7 on the substrate. The pixel defining layer 7 is used to define the area where the red light emitting element 3, the green light emitting element 1 and the blue light emitting element 4 are located, and the black matrix 8 is used to block the area where the pixel defining layer 7 is not used for display, thereby ensuring the normal display of the organic light emitting diode display panel.

In this example, the OLED device further includes a flat layer 9, and the flat layer 9 is disposed on a side of the red color film layer 5, the green color film layer 2 and the blue color film layer 6 away from the red light emitting element 3, the green light emitting element 1 and the blue light emitting element 4. The flat layer 9 can ensure that the surface of the display side of the entire organic light emitting diode display panel (including the OLED device) is flat, thereby improving its display effect.

In addition, in this example, the OLED device further includes a encapsulating layer 10, and the encapsulating layer 10 is disposed between the red color film layer 5, the green color film layer 2 and the blue color film layer 6 and the red light emitting element 3, the green light emitting element 1 and the blue light emitting element 4, and is used to encapsulate the red light emitting element 3, the green light emitting element 1 and the blue light emitting element 4. The arrangement of the encapsulating layer 10 can form a good encapsulation for the red light emitting element 3, the green light emitting element 1, and the blue light emitting element 4, so as to prevent external water and oxygen from intruding into an interior of the organic light emitting diode device, which will cause the corrosion and damage to the organic light emitting diode device.

In this example, by disposing a color film layer on the light exit side of the sealed organic light emitting diode device, the reflectivity of the organic light emitting diode display panel including the OLED device can be reduced and the color purity thereof can be improved, while the thickness of the display panel can be reduced. Therefore, it is advantageous to realize random bending of the organic light emitting diode display panel.

Based on the above structure of the OLED device, this example also provides a method for manufacturing the OLED device, including:

step S101: providing a substrate;

step S102: providing a green light emitting element on the substrate;

step S103: forming a green color resist film layer on the light exit side of the green light emitting element;

In this step, a green color resist film layer is formed by a conventional coating method.

step S104: forming a pattern including a green color film layer by adjusting the irradiation time of the exposure light to the green color resist film layer using a digital gray scale adjustment method;

wherein a travel distance of the light emitted from the green light emitting element in the green color film layer remains substantially unchanged with a change of the light exit angle.

In this step, the green color resist film layer is exposed using a digital exposure machine, and then the pattern of the green color film layer is formed by development. The digital exposure machine exposes the green color resist film layer through digital gray scale adjustment method, the specific exposure principle is as follows: the digital exposure machine simulates the gray level of exposure light, and the gray level of the exposure light is adjusted by the voltage pulse width, so as to adjust the exposure time of the exposure light, and further adjust the exposure amount to achieve the exposure of the green color resist film layer. The digital gray scale adjustment exposure method of the digital exposure machine is a mature technology and it is unnecessary to go into details here.

In this example, as shown in FIG. 6, FIG. 7*a*, FIG. 7*b*, FIG. 7*c*, and FIG. 8, an area of the green color resist film layer corresponding to the green light emitting element is a first area 11; the green color resist film layer is formed by using negative photoresist, and the irradiation time of exposure light to the peripheral edge portion 110 of the first area 11 is less than the irradiation time of exposure light to the middle portion 111 of the first area 11. Optionally, in this example, in the direction P from one side edge of the first region 11 toward the other side edge opposite to the one side edge, the irradiation time of the exposure light changes in a parabolic manner. The specific amplitude of the parabola varies depending on the actual exposure process, the exposure equipment, and the material of the green color resist film layer. In this way, the so-formed green color film layer 2 can satisfy that the travel distance L of the light emitted by the green light emitting element in the green color film layer remain change with the change of the light exit angle θ.

In this example, the method for manufacturing an OLED device further includes:

- step S201: providing a red light emitting element and a blue light emitting element on the substrate;
- step S202: forming a red color resist film layer on a light exit side of the red light emitting element.
- step S203: forming a pattern including the red color film layer by adjusting the irradiation time of the exposure light to the red color resist film layer using a digital gray scale adjustment method.
- step S301: forming a blue color resist film layer on a light exit side of the blue light emitting element.
- step S302: forming a pattern including the blue color film layer by adjusting the irradiation time of the exposure light to the blue color resist film layer using a digital gray scale adjustment method.

And, the travel distance of the light emitted from the red light emitting element and the blue light emitting element in the red color film layer and the blue color film layer respectively, increases as light exit angles increase, so that the color purity of the light emitted from the red light emitting element and the blue light emitting element remains changed after passing through the red color film layer and the blue color film layer respectively.

In this example, as shown in FIG. 9, FIG. 10a, FIG. 10b, FIG. 10c and FIG. 11, an area of the red color resist film layer corresponding to the red light emitting element is a second area 12; the irradiation time of exposure light to the entire of the second area 12 is the same. Optionally, in this example, in the direction P' from the one side edge of the second region 12 toward the other side edge opposite to the one side edge, the irradiation time of the exposure light does not change. The specific exposure amount indicated by the straight line varies depending on the actual exposure process, the exposure equipment, and the material of the red color resist film layer. In this way, the so-formed red color film layer can satisfy that the travel distance L1 of the light emitted from the red light emitting element in the corresponding red color film layer 5 increases as the light exit angle θ1 increases.

In this example, as shown in FIG. 12, FIG. 13a, FIG. 13b, FIG. 13c and FIG. 14, an area of the blue color resist film layer corresponding to the blue light emitting element is a third area 13; the irradiation time of exposure light to the entire of the third area 13 is the same. Optionally, in this example, in the direction P' from the one side edge of the third region 13 toward the other side edge opposite to the one side edge, the irradiation time of the exposure light does not change. The specific exposure amount indicated by the straight line varies depending on the actual exposure process, the exposure equipment, and the material of the blue color resist film layer. In this way, the so-formed blue color film layer 6 can satisfy that the travel distance L1 of the light emitted from the blue light emitting element in the corresponding blue color film layer 6 increases as the light exit angle θ1 increases.

It should be noted that the red color film layer and the blue color film layer may also be prepared by using a conventional low-temperature yellow light process, and the specific preparation method is not described again. The prepared red color film layer and the blue color film layer can also meet the requirements.

In addition, in the present example, the manufacture of other structural film layers such as pixel defining layer, black matrix, flat layer, and the like adopts a conventional manufacturing method, and the encapsulating layer encapsulates the organic light emitting diode device using a conventional encapsulation method, which will not be described in details.

As described above, by making the travel distance of the light emitted from the green light emitting element in the green color film layer remain substantially unchanged with the change of the light exit angle, the color purity of the green light passing through the green color film layer can be prevented from changing, thereby improving the color shift performance of the green light passing through the green color film layer, and improving the optical performance of the green light, and thus further improving the display effect of the organic light emitting diode device and the display panel.

In some examples, an organic light emitting diode display panel including any one of the above OLED is provided. The organic light emitting diode display panel may also include other conventional components such as an encapsulating layer and the like.

By adopting the OLED device described above, the display effect and display quality of the display panel are improved.

In some examples, a display device including any one of the above organic light emitting diode display panel is provided. The display device may also include other conventional components such as circuit boards and the like.

Through the above organic light emitting diode display panel, the display effect and display quality of the display device are improved.

The display device provided by the present disclosure may be any product or component that has a display function such as an OLED TV, a display, a mobile phone, a navigator, and the like.

It can be understood that the above examples are merely exemplary examples employed for illustrating the principle of the present disclosure, but the present disclosure is not limited thereto. For a person skilled in the art, various variations and modifications may be made without departing from the spirit and essence of the present disclosure, and these variations and modifications are also considered to be within the protection scope of the present disclosure.

REFERENCE SYMBOLS 1. a green light emitting element; 2. A green color film layer; 3. A red light emitting element; 4. A blue light emitting elements; 5. a red color film layer; 6. A blue color film layer; 7. A pixel defining layer; 8. A black matrix; 9. flat layer; 10. An encapsulating layer; 11. A first area; 110. A peripheral edge portion of the first area; 111. A middle portion of the first area; 12. A second area

What is claimed is:

1. A method for manufacturing an organic light emitting diode device, including:
   providing a substrate,
   providing a green light emitting element on the substrate,
   forming a green color resist film layer on a light exit side of the green light emitting element;
   forming a green color film layer from the green color resist film layer, by adjusting an irradiation time of exposure light irradiated to the green color resist film layer using a digital gray scale adjustment method;
   wherein a travel distance of a light emitted from the green light emitting element in the green color film layer remains substantially unchanged with change of a light exit angle of the light, wherein the green light emitting element is a point light-emitting light source, the travel distance refers to a distance that the light entering from a projection center of the green color film layer on the substrate and emitted by the point light emitting light source travels in the green color film layer when leaving the green color film layer, and the light exit angle refers to an angle between a propagating direction of the light emitted from the point light-emitting light source in the green color film layer and a direction perpendicular to a surface of the organic light emitting diode device, and
   wherein the light emitted by the point light emitting light source enters the green color film layer from the projection center of the green color film layer on the substrate and is deflected at the light exit angle to exit through the green color film layer,
   wherein an area of the green color resist film layer corresponding to the green light emitting element is a first area; and
   the green color resist film layer uses negative photoresist, and an irradiation time of exposure light irradiated to a peripheral edge portion of the first area is less than an irradiation time of exposure light irradiated to a middle portion of the first area.

2. The method for manufacturing an organic light emitting diode device according to claim 1, wherein the green color film layer is hemispherical.

3. The method for manufacturing an organic light emitting diode device according to claim 1, wherein the digital gray scale adjustment method includes: simulating the gray level of the exposure light using a digital exposure machine, adjusting the gray level of the exposure light by the voltage pulse width, so as to adjust the exposure time of the exposure light, and further adjusting the exposure amount to achieve the exposure of the green color resist film layer.

4. The method for manufacturing an organic light emitting diode device according to claim 1, further including:
   providing a red light emitting element and a blue light emitting element on the substrate;
   forming a red color resist film layer on a light exit side of the red light emitting element;
   forming a red color film layer from the red color resist film layer, by adjusting an irradiation time of exposure light irradiated to the red color resist film layer using the digital gray scale adjustment method;
   forming a blue color resist film layer on a light exit side of the blue light emitting element;
   forming a blue color film layer from the blue color resist film layer, by adjusting an irradiation time of exposure light irradiated to the blue color resist layer film using the digital gray scale adjustment method;
   wherein a travel distance of the light emitted from the red light emitting element and the blue light emitting element in the red color film layer and the blue color film layer respectively, increase as light exit angles increase, so that the color purity of a light emitted from the red light emitting element and the blue light emitting element remains unchanged after passing through the red color film layer and the blue color film layer respectively.

5. The method for manufacturing an organic light emitting diode device according to claim 4, wherein an area of the red color resist film layer corresponding to the red light emitting element is a second area; and an area of the blue color resist film layer corresponding to the blue light emitting element is a third area;
   an irradiation time of exposure light irradiated to the second area is the same on the entire portion; and
   an irradiation time of exposure light irradiated to the third area is the same on the entire portion.

6. The method for manufacturing an organic light emitting diode device according to claim 4, wherein the red light emitting element and the blue light emitting element are point light-emitting light sources, the travel distance refers to a distance that the light entering from a projection center of the red color film layer or the blue color film layer on the substrate and emitted by the point light emitting light source travels in the red color film layer and the blue film layer, respectively, when leaving the red color film layer or the blue color film layer respectively, and the light exit angle refers to a angle between a propagating direction of the light emitted from the point light-emitting light source in the red color film layer or the blue color film layer and a direction perpendicular to a surface of the organic light emitting diode device.

7. The method for manufacturing an organic light emitting diode device according to claim 4, further including:
   disposing a encapsulating layer between the red color film layer, the green color film layer and the blue color film layer and the red light emitting element, the green light emitting element and the blue light emitting element to encapsulate the red light emitting element, the green light emitting element and the blue light emitting element.

8. The method for manufacturing an organic light emitting diode device according to claim 4, wherein the red color film layer and the blue color film layer are both hemi-ellipsoidal.

9. The method for manufacturing an organic light emitting diode device according to claim 4, further including:
   disposing a pixel defining layer in the same layer as the red light emitting element, the green light emitting element and the blue light emitting element, and the pixel defining layer separates the red light emitting element, the green light emitting element and the blue light emitting element from each other; and
   disposing a black matrix in the same layer as the red color film layer, the green color film layer and the blue color film layer, and the black matrix separates the red color film layer, the green color film layer and the blue color film layer from each other; and
   wherein a orthogonal projection of the red light emitting element on the substrate coincides with a orthogonal projection of the red color film layer on the substrate, a orthogonal projection of the green light emitting element on the substrate coincides with a orthogonal projection of the green color film layer on the substrate, a orthogonal projection of the blue light emitting element on the substrate coincides with a orthogonal projection of the blue color film layer on the substrate, and a orthogonal projection of the black matrix on the substrate coincides with a orthogonal projection of the pixel defining layer on the substrate.

10. The method for manufacturing an organic light emitting diode device according to claim 4, further including:
disposing a flat layer on a side of the red color film layer, the green color film layer and the blue color film layer away from the red light emitting element, the green light emitting element and the blue light emitting element.

11. The method for manufacturing an organic light emitting diode device according to claim 1, wherein in a direction from one side edge of a first region toward the other side edge opposite to the one side edge, the irradiation time of the exposure light changes in a parabolic manner.

12. A method for manufacturing an organic light emitting diode display panel, including the method for manufacturing an organic light emitting diode device according to claim 1.

13. A method for manufacturing display device, including the method for manufacturing an organic light emitting diode display panel according to claim 12.

* * * * *